US009182447B2

(12) United States Patent
Abe et al.

(10) Patent No.: US 9,182,447 B2
(45) Date of Patent: Nov. 10, 2015

(54) TANK-TYPE SWITCHING DEVICE

(75) Inventors: Junichi Abe, Tokyo (JP); Shinji Sato, Tokyo (JP); Tomoko Tanabe, Tokyo (JP); Naoaki Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 99 days.

(21) Appl. No.: 14/112,115

(22) PCT Filed: Dec. 9, 2011

(86) PCT No.: PCT/JP2011/078546
§ 371 (c)(1),
(2), (4) Date: Oct. 16, 2013

(87) PCT Pub. No.: WO2012/157138
PCT Pub. Date: Nov. 22, 2012

(65) Prior Publication Data
US 2014/0028319 A1    Jan. 30, 2014

(30) Foreign Application Priority Data
May 16, 2011 (JP) ................................. 2011-109336

(51) Int. Cl.
*G01R 31/02* (2006.01)
*H01H 31/12* (2006.01)
*G01R 31/327* (2006.01)
(Continued)

(52) U.S. Cl.
CPC ............. *G01R 31/327* (2013.01); *H01H 33/26* (2013.01); *H01H 33/59* (2013.01); *G01R 31/1254* (2013.01); *H02B 13/065* (2013.01)

(58) Field of Classification Search
CPC ...... H01H 33/26; H01H 33/59; G01R 31/327; G01R 31/1254; H02B 13/065
USPC .................................. 324/415, 541, 551, 552
See application file for complete search history.

(56) References Cited

U.S. PATENT DOCUMENTS 6,483,316 B2 * 11/2002 Kato et al. ..................... 324/536
6,850,399 B1 * 2/2005 Kato et al. ................... 361/93.1
(Continued)

FOREIGN PATENT DOCUMENTS

| CN | 1790041 A | 6/2006 |
|---|---|---|
| JP | 59 160924 | 9/1984 |

(Continued)

OTHER PUBLICATIONS

International Search Report Issued Jan. 10, 2012 in PCT/JP11/78546 Filed Dec. 9, 2011.

(Continued)

*Primary Examiner* — Jermele M Hollington
*Assistant Examiner* — Farhana Hoque
(74) *Attorney, Agent, or Firm* — Oblon, McClelland, Maier & Neustadt, L.L.P.

(57) ABSTRACT

A discharge location determination unit includes: discharge detection circuits connected to metal electrodes, respectively, and to which a signal due to discharge is input; and a calculation circuit to which signals output from the discharge detection circuits are input, wherein, if the intensity difference or intensity ratio between the two output signals is within a predetermined value, the calculation circuit determines that the discharge location is inside a tank, otherwise the calculation circuit determines that the discharge location is outside the tank.

6 Claims, 4 Drawing Sheets

(51) Int. Cl.
   *H01H 33/26* (2006.01)
   *H01H 33/59* (2006.01)
   *G01R 31/12* (2006.01)
   *H02B 13/065* (2006.01)

(56) References Cited

U.S. PATENT DOCUMENTS

| | | |
|---|---|---|
| 2002/0024341 A1 | 2/2002 | Rokunohe et al. |
| 2003/0112569 A1 | 6/2003 | Kato et al. |
| 2005/0135028 A1 | 6/2005 | Kato et al. |
| 2005/0135029 A1 | 6/2005 | Kato et al. |
| 2010/0241372 A1* | 9/2010 | Xu et al. .......... 702/58 |

FOREIGN PATENT DOCUMENTS

| | | |
|---|---|---|
| JP | 3 057977 | 3/1991 |
| JP | 05 019006 | 1/1993 |
| JP | 7 231558 | 8/1995 |
| JP | 08 124753 | 5/1996 |
| JP | 09 191515 | 7/1997 |
| JP | 10 210647 | 8/1998 |
| JP | 11 086689 | 3/1999 |
| JP | 2001 266681 | 9/2001 |
| JP | 2002 071743 | 3/2002 |
| JP | 2003 315404 | 11/2003 |
| JP | 2007 192710 | 8/2007 |
| JP | 2011 097686 | 5/2011 |
| WO | 01 65653 | 9/2001 |

OTHER PUBLICATIONS

Australian Office Action issued Dec. 18, 2014 in Patent Application No. 2011368503.

Combined Chinese Office Action and Search Report issued Feb. 11, 2015 in Patent Application No. 201180069564.5.

* cited by examiner

TANK-TYPE SWITCHING DEVICE

TECHNICAL FIELD

The present invention relates to a tank-type switching device used for switching a circuit in an electric system.

BACKGROUND ART

A vacuum circuit breaker includes a stationary contact and a moving contact that is placed opposite the stationary contact. The stationary contact and the moving contact are placed in a vacuum chamber in which vacuum is maintained around the contacts. With the contacts of the vacuum circuit breaker closed to cause current to flow in a main circuit conductor, when the contacts of the vacuum circuit breaker are opened to interrupt current flowing in the main circuit, if the vacuum degree in the vacuum chamber is high, high arc-suppression capability of vacuum causes current to be interrupted. However, if the vacuum degree in the vacuum chamber is reduced due to factors such as a crack in the vacuum chamber, discharge of gas molecule adsorbed to a metal or insulator, as well as transmission of atmospheric gas, opening the contacts may cause breakdown to prevent the interruption of current, which may damage the equipment in the worst case. Thus, in order to know what is going on in the vacuum circuit breaker without damaging the breaker and its peripheral devices, a vacuum degree deterioration monitoring device for determining whether or not the vacuum degree in the vacuum chamber has deteriorated has been under development.

For example, in existing literatures, a method is disclosed in which the normality of the vacuum degree is determined by detecting, using an antenna mounted in the breaker, electromagnetic wave due to discharge caused by vacuum degree deterioration resulting in withstand voltage reduction (PTL 1). Furthermore, in one discharge detection method, a metal electrode placed in a bushing is used as an antenna to allow a signal having a wide frequency range to be detected (PTL 2). Furthermore, a method is described in which a discharge location is detected using the time difference of a signal received by two or more antennas mounted in the breaker (PTL 3).

Furthermore, a method is described in which a partial discharge occurring area is located by placing discharge detectors at two spots in a gas isolation switching device and comparing the outputs of the detectors (PTL 4).

CITATION LIST

Patent Literature

[PTL 1] JP-A-59-160924
[PTL 2] JP-A-2007-192710
[PTL 3] JP-A-2003-315404
[PTL 4] JP-A-5-19006

SUMMARY OF INVENTION

Technical Problem

A conventional vacuum degree monitoring device and discharge detection device cannot determine whether a detected discharge is a discharge that has occurred in the breaker or has propagated from the outside through a central conductor. So, there may be a case in which, when a signal due to discharge is received, the vacuum degree of a vacuum valve in the breaker is checked with no problem detected, but, it turns out to be due to a discharge outside the breaker. This raises a problem of taking time to determine the discharge location.

Furthermore, detecting a discharge location from the time difference of a discharge signal received by two or more antennas as in a conventional way needs calculation of the time difference with a unit of ns (nanosecond), which raises a problem of requiring a GHz oscillator and a high-performance and high-cost processing device for calculating the time difference.

Furthermore, in comparing outputs of discharge detectors at two spots, based on the fact that when a discharge signal is received by one of the two discharge detectors then the signal decays to reach the other discharge detector with a lower reception intensity, when a signal with a high signal intensity is received by the discharge detectors, it is determined that a discharge has occurred around the detectors, which arises a problem of wrongly determining that a discharge has occurred inside the breaker even when the discharge signal has propagated from the outside.

In view of the above problem, it is an object of the present invention to provide a tank-type switching device that can determine in a simplified manner whether or not a discharge has occurred in the breaker in performing vacuum degree monitoring and discharge detection.

Solution to Problem

A tank-type switching device in accordance with the invention includes: a tank filled with an insulative medium; a current interruption unit placed in the tank; first and second bushings placed at separate locations in the tank; first and second metal electrodes placed in the first and second bushings, respectively, and insulated from the tank; first and second central conductors passing through the first and second bushings, respectively, and connected to the current interruption unit; and a discharge location determination unit that is connected to the first and second metal electrodes and determines from signals detected by the first and second metal electrodes whether a discharge location is inside or outside the tank, wherein the discharge location determination unit includes: first and second discharge detection circuits connected to the first and second metal electrodes, respectively, and to which signals due to discharge are input; and a calculation circuit to which signals output from the first and second discharge detection circuits are input, and wherein the calculation circuit determines the discharge location based on the intensity difference or intensity ratio between the output signals of the first and second discharge detection circuits.

Furthermore, a tank-type switching device in accordance with the invention includes: a tank filled with an insulative medium; a current interruption unit placed in the tank; first and second bushings placed at separate locations in the tank; first and second metal electrodes placed in the first and second bushings, respectively, and insulated from the tank; first and second central conductors passing through the first and second bushings, respectively, and connected to the current interruption unit; and a discharge location determination unit that is connected to the first and second metal electrodes and determines from signals detected by the first and second metal electrodes whether the discharge location is inside or outside the tank, wherein field limiting shields placed in the first and second bushings are used as the first and second metal electrodes.

Advantageous Effects of Invention

Since the tank-type switching device of the invention includes the discharge location determination unit as described above, whether a discharge has occurred inside or outside the tank can be determined in a simplified manner based on the intensity difference or intensity ratio between the signals detected by the first and second metal electrodes.

Another object, feature, aspect and effect of the invention will be apparent from the following detailed description of the invention with reference to the drawings.

DESCRIPTION OF EMBODIMENTS

First Embodiment

Figure 1:
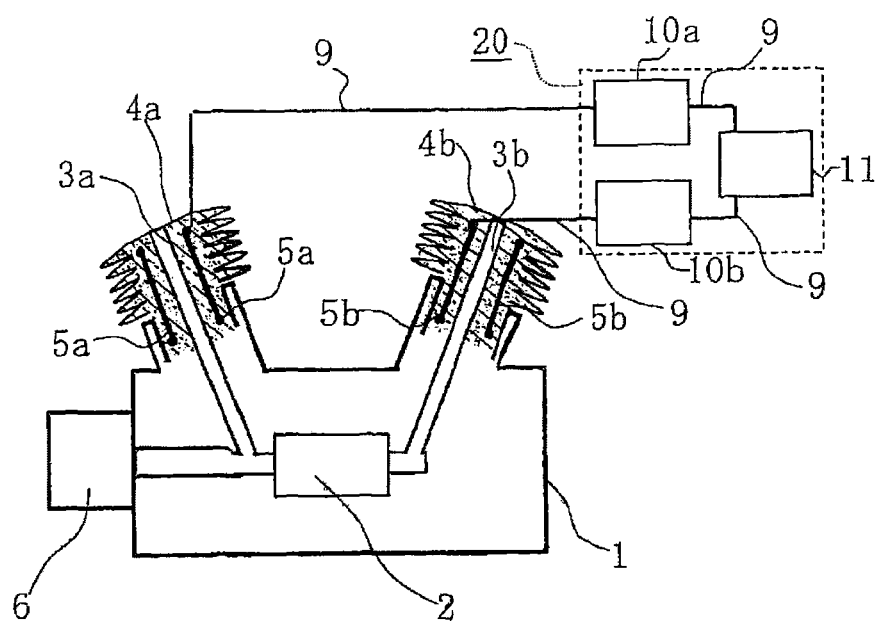
FIG. 1 is a side sectional view of a tank-type switching device of a first embodiment of the invention.

FIG. 1 is a schematic diagram showing a side sectional view of a tank-type switching device in accordance with a first embodiment. This tank-type switching device includes a tank 1 that is covered with a metal and has a ground potential. In the tank 1, central conductors 3a and 3b in which current flows (corresponding to first and second central conductors), a current interruption unit 2 for actually interrupting current and a drive device 6 for driving the current interruption unit 2 are placed. The tank 1 is filled with an insulation gas. The tank 1 also includes bushings 4a and 4b (corresponding to first and second bushings) in a plurality of areas connected to an external conducting path.

Furthermore, metal electrodes 5a and 5b (corresponding to first and second metal electrodes) having the same shape (e.g., a cylindrical shape) and insulated from the grounded tank 1 are embedded around the central conductors 3a and 3b passing through the bushings 4a and 4b. Signals are sent from the metal electrodes 5a and 5b having the same shape to discharge detection circuits 10a and 10b (corresponding to first and second discharge detection circuits) through a signal line 9. The discharge detection circuits 10a and 10b output signals to a calculation circuit 11 through the signal line 9.

Summarizing the above, the tank-type switching device according to the first embodiment includes: the metal tank 1 filled with an insulative medium; the current interruption unit 2 placed in the tank 1; the first and second bushings 4a and 4b having the same shape, placed at separate locations in the tank 1; the first and second metal electrodes 5a and 5b embedded in the first and second bushings 4a and 4b, respectively, and insulated from the tank 1; the first and second central conductors 3a and 3b passing through the first and second bushings 4a and 4b, respectively, and connected to the current interruption unit 2; and a discharge location determination unit 20 that is connected to the first and second metal electrodes 5a and 5b and determines from signals detected by the first and second metal electrodes 5a and 5b whether the discharge location is inside or outside the tank 1. The discharge location determination unit 20 includes: the first and second discharge detection circuits 10a and 10b connected to the first and second metal electrodes 5a and 5b, respectively, and to which signals due to discharge are input; and the calculation circuit 11 to which signals output from the first and second discharge detection circuits 10a and 10b are input.

In the tank-type switching device according to the invention, when an insulation-related problem occurs in the tank 1, a partial discharge occurs near the current interruption unit 2 and an electromagnetic wave is radiated. The insulation-related problems in the tank include, for example, foreign metallic particles attached to a high-field part of the current interruption unit 2, interface insulation failure of a solid insulator, and vacuum degree deterioration (if the current interruption unit 2 is a vacuum valve).

When a partial discharge occurs, if the discharge location is inside the tank 1, an electromagnetic wave due to the discharge propagates to the metal electrodes 5a and 5b almost at the same time with the same level.

On the other hand, when a discharge occurs outside the tank 1, a signal due to the discharge often propagates to the metal electrodes through a conductor. Then, when the bushing 4a is closer to the discharge location than the bushing 4b, an electromagnetic wave that propagates from the central conductor 3a to the metal electrode 5a is detected by the first discharge detection circuit 10a, and an electromagnetic wave that propagates from the central conductor 3a through the current interruption unit 2 and the central conductor 3b to the metal electrode 5b is detected by the second discharge detection circuit 10b, then the two signals are not detected at the same time with the same level.

Accordingly, when the two signals do not propagate to the metal electrodes 5a and 5b at the same time with the same level, it can be estimated that the discharge has occurred outside the tank. So, the calculation circuit 11 can make a comparison with the intensity difference or intensity ratio between the output signals of the discharge detection circuits 10a and 10b to determine that the discharge has occurred inside the tank 1 when the intensity difference or intensity ratio is within the predetermined value; otherwise determine that the discharge has occurred outside the tank 1.

Note that, when the distance between the metal electrodes 5a and 5b is 5 m or so, if the arrival time difference of the signal is less than a few nanoseconds, the arrival time difference should be considered to be zero. The intensity of the signal varies depending on discharge intensity, propagation distance and the like, and takes a value with a unit of mV or V. For example, in determining the intensity difference, if one signal has an intensity ten or more times greater than the other signal, the calculation circuit 11 determines that the intensity difference is significant; otherwise the calculation circuit 11 determines that the intensity difference is not significant.

Summarizing the above, according to the tank-type switching device according to the first embodiment, with the first and second metal electrodes 5a and 5b having the same shape, based on the intensity difference or intensity ratio and the arrival time difference between the output signals of the first and second discharge detection circuits 10a and 10b, if the intensity difference or intensity ratio and the arrival time difference are within their respective predetermined values, the calculation circuit 11 determines that the discharge location is inside the tank 1, and if one or both of the intensity difference or intensity ratio and the arrival time difference are outside their respective predetermined values, the calculation circuit 11 determines that the discharge location is outside the tank 1, which provides an effect that whether the discharge location is inside or outside the tank can be properly determined easily without using a high-precision measuring instrument or the like Furthermore, using both data of the intensity difference or intensity ratio and the arrival time difference between the output signals allows obtaining more precise determination result in comparison with determination depending on only one of the data.

Figure 2:
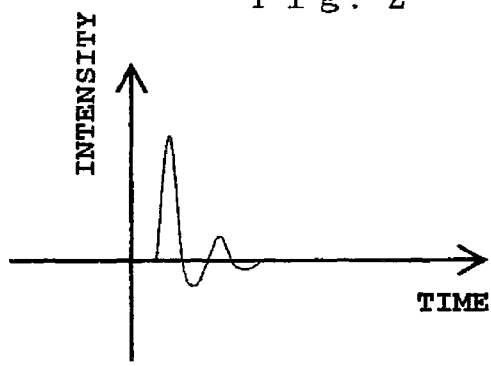
FIG. 2 is a detection example of a signal detected by a discharge detection circuit of the first embodiment of the invention.

FIG. 2 shows a detection example of an electromagnetic wave detected by the discharge detection circuit 10a or 10b. The vertical axis indicates the intensity of the signal, and the horizontal axis indicates the time. This shows a waveform that has a strong peak at the beginning after a discharge occurs and then decays while swinging around the horizontal axis as time elapses. The detected data may be processed in a various way. For example, one way is that the calculation circuit 11 performs processing based on the intensity and time at the point at which the intensity peaks.

Note that field limiting shields placed in the bushings 4a and 4b may also be used as the metal electrodes 5a and 5b. In this case, in the case of preparing the bushings 4a and 4b, the metal electrodes 5a and 5b may be used as the tank-type switching device of the invention without embedding and forming the metal electrodes 5a and 5b as a separate component. Note that the frequency band in which the metal electrodes 5a and 5b as antennas have high reception intensity is in a low frequency band, i.e., 100-200 MHz band, which is determined so as to correspond to the band of the discharge signal.

If the metal electrodes 5a and 5b have different shapes, the intensity difference between the detected signals may be significant even when the discharge location is inside the tank. So, in order to perform determination based on the intensity difference or intensity ratio, the metal electrodes 5a and 5b need to have the same shape.

Second Embodiment

Next, the layout of the two bushings 4a and 4b of the tank-type switching device of the invention is described.

Figure 3:
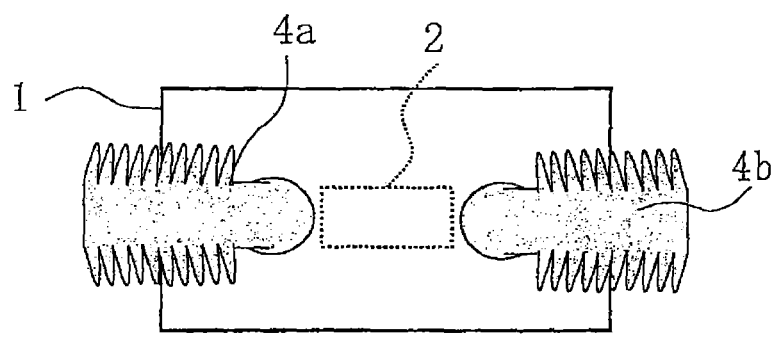
FIG. 3 is a top view showing a layout example of a tank in a tank-type switching device of a second embodiment of the invention.
Figure 4:
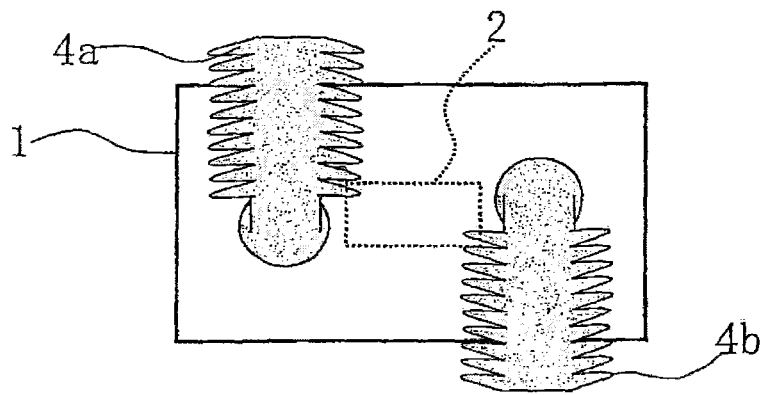
FIG. 4 is a top view showing a layout example of another tank in the tank-type switching device of the second embodiment of the invention.
Figure 5:
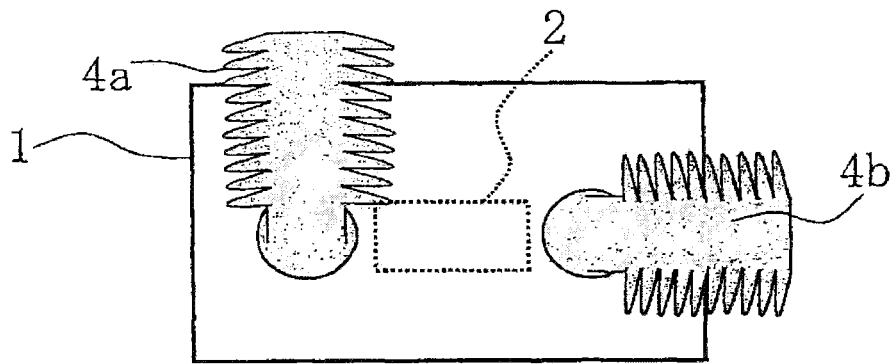
FIG. 5 is a top view showing a layout example of another tank in the tank-type switching device of the second embodiment of the invention.

FIG. 3 is a top view of the tank 1. The bushings 4a and 4b are placed bilaterally symmetrically about the center of the tank 1. Or the bushings 4a and 4b may be placed such that the bushing 4a faces toward the top of the paper and the bushing 4b faces toward the bottom as shown in FIG. 4. Or even when the bushings 4a and 4b are placed such that the bushing 4a faces toward the top of the paper and the bushing 4b faces toward the right as shown in FIG. 5, if the distances from the current interruption unit 2 to the bushings 4a and 4b are the same, whether or not the discharge location is inside the tank 1 may be determined as shown in the first embodiment.

Third Embodiment

As described above, the first embodiment shows the example in which the calculation circuit 11 determines whether the discharge location is inside or outside the tank 1, based on a plurality of data of the intensity difference or intensity ratio and the arrival time difference between the output signals of the discharge detection circuits 10a and 10b. However, a third embodiment shows an example in which the discharge location is determined only based on the intensity difference or intensity ratio. Specifically, with the first and second metal electrodes 5a and 5b having the same shape, based on the intensity difference or intensity ratio between the output signals of the first and second discharge detection circuits 10a and 10b, if the intensity difference or intensity ratio is outside a predetermined value, the calculation circuit 11 determines that the discharge location is outside the tank 1, and if the intensity difference or intensity ratio is within the predetermined value, the calculation circuit 11 determines that the discharge location is inside the tank 1. Thus, it is also possible to determine the discharge location only based on the intensity difference or intensity ratio between the output signals of the discharge detection circuits 10a and 10b.

Fourth Embodiment

As described above, the third embodiment shows the example in which the calculation circuit 11 determines the discharge location only based on the intensity difference or intensity ratio between the output signals of the discharge detection circuits 10a and 10b. However, a fourth embodiment shows an example in which whether the discharge location is inside or outside the tank 1 is determined only based on the arrival time difference between the output signals. Based on the arrival time difference between the output signals of the first and second discharge detection circuits 10a and 10b, if the arrival time difference is outside a predetermined value, the calculation circuit 11 determines that the discharge location is outside the tank 1, and if the arrival time difference is within the predetermined value, the calculation circuit 11 determines that the discharge location is inside the tank 1.

Note that, for the determination based on the arrival time difference between the signals as with the fourth embodiment, the metal electrodes 5a and 5b are not required to have the same shape, which increases the setting tolerance of the metal electrodes 5a and 5b.

Fifth Embodiment

Figure 6:
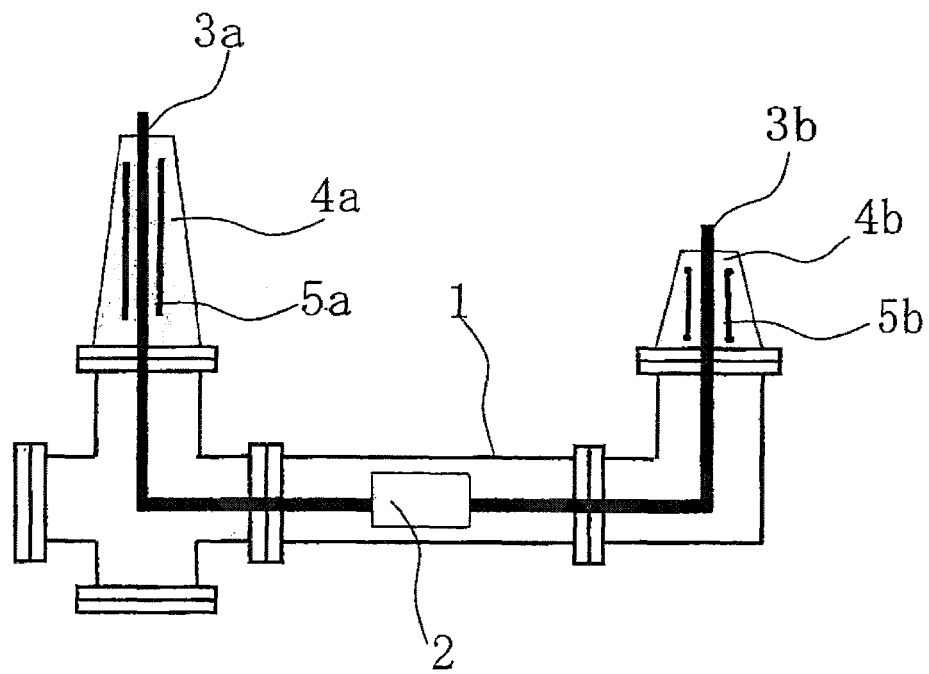
FIG. 6 is a side sectional view of a tank-type switching device of a fifth embodiment of the invention.

FIG. 6 is a schematic diagram showing a side sectional view of a tank-type switching device in accordance with a fifth embodiment. Since there is no metal barrier plate or the like between central conductors 3a and 3b in the tank 1, reflection of an electromagnetic wave generated by discharge never occurs, so the signal propagates to the metal electrodes 5a and 5b with no decay. In the first embodiment, the bushings 4a and 4b have the same shape. However, the bushings 4a and 4b are not required to have the same shape, as shown in FIG. 6.

When a discharge occurs in the current interruption unit 2 of the tank-type switching device shown in FIG. 6, since the bushings have different shapes and the distances from the discharge location to the metal electrodes 5a and 5b are not the same unlike the first embodiment, the discharge signal is not equivalently received by the metal electrodes 5a and 5b. The metal electrodes 5a and 5b receive the discharge signal at the signal intensity ratio determined by the distances from the discharge location to the metal electrodes 5a and 5b.

Accordingly, if the signal intensity ratio at which the metal electrodes 5a and 5b receive the signal is within a predetermined value, it can be determined that the discharge location is inside the tank 1, otherwise it can be determined that the discharge location is outside the tank 1.

Sixth Embodiment

Figure 7:
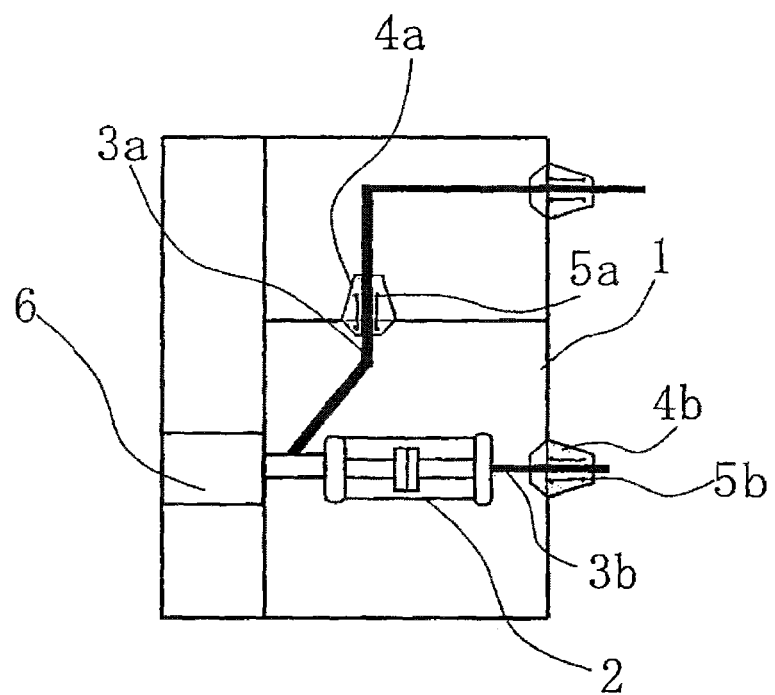
FIG. 7 is a side sectional view of a tank-type switching device of a sixth embodiment of the invention.

FIG. 7 is a schematic diagram showing a side sectional view of a tank-type switching device in accordance with a sixth embodiment. As described above, the fifth embodiment shows the example in which the bushings have different shapes. However, a sixth embodiment shows an example in which the bushings have the same shape but the distances from the current interruption unit 2 to the bushings are different.

When a discharge occurs in the current interruption unit 2 of the tank-type switching device shown in FIG. 7, since the distances from the discharge location to the metal electrodes 5a and 5b are not the same as with the fifth embodiment, the discharge signal is not equivalently received by the metal electrodes 5a and 5b.

However, in the sixth embodiment, the difference between the distances from the discharge location to the metal electrodes 5a and 5b is less than 1-2 m at the longest, so the received signal intensities are not so much different. However, if the signal intensity ratio is within a predetermined value, it can be determined that the discharge location is inside the tank 1, otherwise it can be determined that the discharge location is outside the tank 1.

Note that the embodiments of the invention may be freely combined or appropriately modified or omitted within the scope of the invention.

The invention claimed is:

1. A tank-type switching device comprising:
a tank filled with an insulative medium;
a current interrupter placed in the tank;
a first bushing and a second bushing placed at separate locations in the tank;
a first metal electrode and a second metal electrode placed in the first bushing and the second bushing, respectively, and insulated from the tank;
a first central conductor and a second central conductor passing through the first bushing and the second bushing, respectively, and connected to the current interrupter; and
a discharge location determination circuit that is connected to the first metal electrode and the second metal electrode and determines from signals detected by the first metal electrode and the second metal electrode whether a discharge location is inside or outside the tank, wherein the discharge location determination circuit includes
a first discharge detection circuit and a second discharge detection circuit connected to the first metal electrode and the second metal electrode, respectively, and to which signals due to discharge are input; and
a calculation circuit to which signals output from the first discharge detection circuit and the second discharge detection circuit are input, and wherein the calculation circuit determines the discharge location based on an amplitude difference or an amplitude ratio between the output signal of the first discharge detection circuit and the output signal of the second discharge detection circuit.

2. The tank-type switching device according to claim 1, wherein the first bushing and the second bushing have a same shape, and are placed at a same distance from the current interrupter.

3. The tank-type switching device according to claim 1, wherein the first metal electrode and the second metal electrode have a same shape, and based on the amplitude difference or the amplitude ratio between the output signal of the first discharge detection circuit and the output signal of the second discharge detection circuit, if the amplitude difference or the amplitude ratio is within a predetermined value, the calculation circuit determines that the discharge location is inside the tank, otherwise the calculation circuit determines that the discharge location is outside the tank.

4. The tank-type switching device according to claim 1, wherein the calculation circuit determines the discharge location based on the amplitude difference or the amplitude ratio between the output signal of the first discharge detection circuit and the output signal of the second discharge detection circuit in combination with an arrival time difference between the output signal of the first discharge detection circuit and the output signal of the second discharge detection circuit.

5. The tank-type switching device according to claim 1, wherein the first metal electrode and the second metal electrode have a same shape, and based on the amplitude difference or the amplitude ratio and an arrival time difference between the output signal of the first discharge detection circuit and the output signal of the second discharge detection circuit, if the amplitude difference or the amplitude ratio and the arrival time difference are within their respective predetermined values, the calculation circuit determines that the discharge location is inside the tank, and if one or both of the amplitude difference or the amplitude ratio and the arrival time difference are outside their respective predetermined values, the calculation circuit determines that the discharge location is outside the tank.

6. The tank-type switching device according to claim 1, wherein field limiting shields placed in the first bushing and the second bushing are used as the first metal electrode and the second metal electrode.

* * * * *